United States Patent [19]

Yamazaki

[11] E Patent Number: Re. 33,208

[45] Reissued Date of Patent: May 1, 1990

[54] PHOTOELECTRIC CONVERSION PANEL AND ASSEMBLY THEREOF

[75] Inventor: Shunpei Yamazaki, Tokyo, Japan

[73] Assignee: Semiconductor Energy Laboratory Co.,Ltd., Tokyo, Japan

[21] Appl. No.: 156,905

[22] Filed: Feb. 17, 1988

Related U.S. Patent Documents

Reissue of:

[64] Patent No.: 4,571,446
Issued: Feb. 18, 1986
Appl. No.: 614,211
Filed: May 25, 1984

[30] Foreign Application Priority Data

May 25, 1983 [JP] Japan ..... 58-92177

[51] Int. Cl.[5] ..... H01L 25/02; H01L 31/06; H02N 6/00

[52] U.S. Cl. ..... 136/244; 136/256; 136/258; 357/30; 357/80

[58] Field of Search ..... 136/244, 256, 258 PC, 136/258 AM; 357/2, 30 J, 30 K, 80

[56] References Cited

U.S. PATENT DOCUMENTS

| | | | |
|---|---|---|---|
| 3,991,228 | 11/1976 | Carlson et al. | 427/39 |
| 4,152,535 | 5/1979 | Deminet et al. | 136/258 PC |
| 4,371,740 | 2/1983 | Clem | 136/256 |
| 4,400,577 | 8/1983 | Spear | 136/259 |
| 4,410,558 | 10/1983 | Izu et al. | 427/39 |
| 4,510,344 | 4/1985 | Berman | 136/256 |
| 4,667,214 | 5/1987 | Sekimura et al. | 357/30 |

*Primary Examiner*—Aaron Weisstuch
*Attorney, Agent, or Firm*—Gerald J. Ferguson, Jr.

[57] ABSTRACT

A photoelectric conversion panel which includes a PIN type non-single-crystal semiconductor laminated photoelectric conversion member formed on a substrate, the substrate is formed by a thin, flexible, chemically reinforced glass sheet.

A plurality of such photoelectric conversion panels are arranged side by side by means of a flexible plastic frame reinforced with carbon fibers.

11 Claims, 1 Drawing Sheet

PHOTOELECTRIC CONVERSION PANEL AND ASSEMBLY THEREOF

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a photoelectric conversion panel and an assembly comprised of a plurality of such panels.

2. Description of the Prior Art

A photoelectric conversion panel now widely employed is provided with a light-transparent substrate and a photoelectric conversion laminate member formed thereon. The photoelectric conversion laminate member is comprised of a light-transparent first conductive layer, a PIN type non-single-crystal semiconductor laminate member, and a second conductive layer laminated in this sequential order. The PIN type non-single-crystal semiconductor layer includes at least a P- or N-type first non-single-crystal semiconductor layer, an I-type second non-single-crystal semiconductor layer formed on the first non-single-crystal semiconductor layer, and a third non-single-crystal semiconductor layer formed on the second non-single-crystal semiconductor layer and opposite in conductivity type from the first non-single-crystal semiconductor layer. Accordingly, the PIN type non-single-crystal semiconductor layer has formed therein at least one PIN junction.

With such a photoelectric conversion panel, photovoltage is generated across the first and second conductive layers upon irradiation of the PIN type non-single-crystal semiconductor layer by light passing through the substrate and the first conductive layer. The photovoltage is provided to the outside via leads connected to the first and second conductive layers.

Such a photoelectric conversion panel is usually installed outdoors, and hence is exposed to the weather. Accordingly, the substrate is subjected to bending stresses by wind pressure.

Conventional photoelectric conversion panels usually have their substrates formed by relatively thick and almost inflexible sheet glass.

The substrate of such sheet glass is broken when subjected to a bending force exceeding a certain value, resulting in the photoelectric panel generating no more photovoltage.

Further, the sheet glass forming the substrate is so brittle that it readily cracks under stress or even when hit by a pebble.

The conventional photoelectric conversion panel is defective in that since the substrate is formed by relatively thick sheet glass, it is heavy and difficult to handle, coupled with the inflexibility and fragility of the substrate.

Conventionally there has also been employed a photoelectric conversion panel assembly of the type wherein a plurality of such photoelectric conversion panels as mentioned above are mounted in a frame so that they are arranged in substantially the same plane.

With such a photoelectric conversion panel assembly, it is possible to obtain high photovoltage by electrically connecting the photoelectric conversion panels in series and high photo current by electrically connecting the panels in parallel.

In this case, however, since the photoelectric conversion panel assembly is exposed to the weather, the frame of the panel assembly as well as the substrate of each panel are subjected to bending stresses by wind pressure.

The conventional panel assembly usually has an aluminum frame which is almost inflexible.

As is the case with the abovesaid glass substrate, the aluminum frame, when subjected to a bending force exceeding a certain value, is broken, resulting in the panel assembly being broken up.

Besides, the conventional photoelectric conversion panel assembly is difficult to handle, since its frame and panels are practically inflexible.

SUMMARY OF THE INVENTION

It is therefore an object of the present invention to provide a novel photoelectric conversion panel free from the abovesaid defects and a photoelectric conversion panel assembly which employs such photoelectric conversion panels and is also free from the abovementioned drawbacks of the prior art.

In accordance with an aspect of the present invention, the light-transparent substrate of the photoelectric conversion panel is formed by a known thin, flexible, chemically reinforced glass sheet which has potassium containing glass layers formed in the sides of the opposite main surfaces of an alkali free or alkali containing glass sheet.

With the photoelectric conversion panel of the present invention, since the substrate is formed by the abovesaid thin, flexible chemical reinforced glass sheet, there is substantially no possibility of the substrate being broken even if exposed to a high wind pressure. Further, the substrate does not crack when hit by a small object such as a pebble. In addition, the substrate is lightweight. Accordingly, the substrate is suitable for use in photoelectric conversion panels which are used under severe outdoor conditions.

In accordance with another aspect of the present invention, the abovesaid thin, flexible, chemically reinforced glass sheet serving as the substrate is reinforced by carbon fibers or carbon cloths disposed in or on at least one main surface of the glass sheet. Accordingly, the substrate is mechanically strong as compared with the abovesaid substrate.

The photoelectric conversion panel with such a substrate also possesses the same excellent features as those obtainable with the abovesaid photoelectric conversion panel.

In accordance with another aspect of the present invention, the photoelectric conversion panel has, between the thin, flexible, chemically reinforced glass sheet and the laminate member for photoelectric conversion, an impurity blocking layer for preventing potassium and impurities from entering into the latter from the former. The photoelectric conversion panel using such an impurity blocking layer possesses the advantage that the characteristic of the laminate member is not deteriorated by the long-term use of the panel.

In accordance with another aspect of the present invention, the photoelectric conversion panel assembly has a construction wherein a plurality of photoelectric conversion panels such as mentioned above are mounted in a frame so that they are arranged in substantially the same plane. In this case, the frame is formed of flexible plastic reinforced by carbon fiber.

With such a photoelectric conversion panel assembly of the present invention, even if it is exposed to a strong wind, the frame bends together with the photoelectric conversion panels, so that the panel assembly is not damaged.

Accordingly, the photoelectric conversion panel assembly of the present invention is of great utility in practical use.

Other objects, features, and advantages of the present invention will become more fully apparent from the following description taken in conjunction with the accompanying drawings.

DESCRIPTION OF THE PREFERRED EMBODIMENTS

Figure 1:
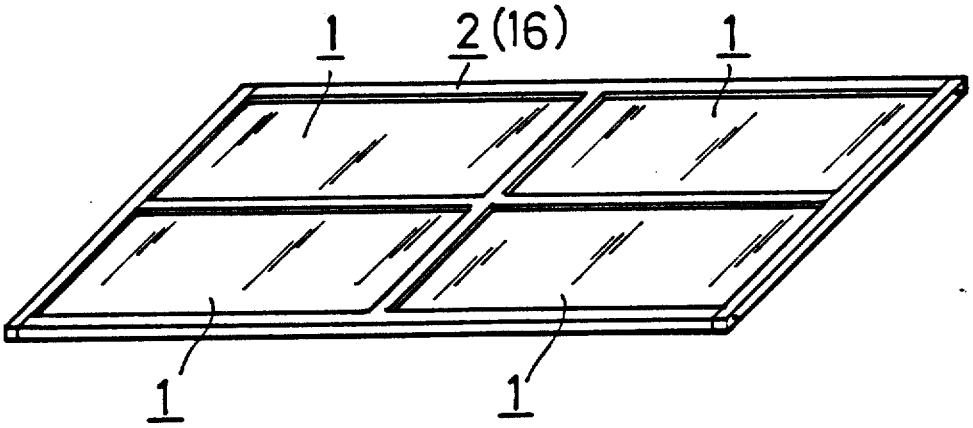
FIG. 1 is a schematic perspective view illustrating an example of the photoelectric conversion panel assembly of the present invention which employs a plurality of photoelectric conversion panels of the present invention.

FIG. 1 illustrates the photoelectric conversion panel assembly of the present invention, in which a plurality of photoelectric conversion panels 1 of the present invention are disposed in the same plane. In FIG. 1, the panel assembly is shown to be comprised of four panels 1 which are disposed in a matrix form.

Figure 2:
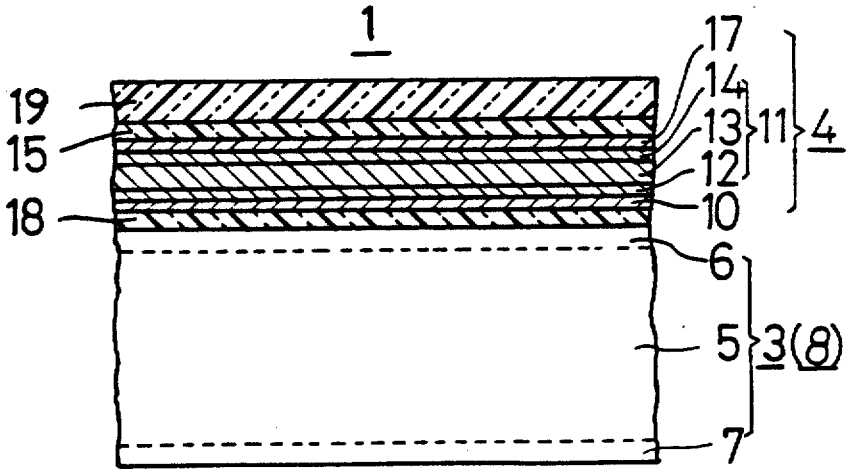
FIG. 2 is a partly enlarged sectional view schematically showing an example of the photoelectric conversion panel of the present invention.

As shown in FIG. 2, the photoelectric conversion panels 1 which each measure, for example, 60×20 cm, comprise a light-transparent substrate 3 and a laminate member 4 formed thereon for photoelectric conversion.

The substrate 3 is a known thin, flexible, chemically reinforced glass sheet 8 which has thin potassium glass layers 6 and 7 formed 40 to 50μ thick in opposite main surfaces of a thin alkali free or alkali containing glass sheet 5 having a thickness of 0.2 to 1.2 mm. In the case where the glass sheet 5 is a sodium glass sheet, potassium containing glass layers 6 and 7 each have a composition such that sodium present in the sides of the main surfaces of the sodium glass sheet has been replaced with potassium having a larger atomic radius than the sodium. When the glass sheet 5 is an alkali free glass sheet, the potassium containing glass layers 6 and 7 each have such a structure that the sides of the main surfaces of the alkali free glass sheet each have potassium introduced therein.

By virtue of the inclusion of the potassium containing glass layers 6 and 7, the thin, flexible, chemically reinforced glass sheet 8 has such great flexibility that it can be bent with a bend radius of 1 to 2 m, i.e. less than 3 m.

Such a glass sheet 8 may be provided therein or on at least one main surface thereof with carbon fibers disposed in a mesh- or grid-like form or at random, or with carbon fiber cloths. The glass sheet 8 with such carbon fibers or carbon fiber cloths has greater flexibility than when such carbon fibers or carbon fiber cloths are not used.

The laminate member 4, formed on the thin, flexible, chemically reinforced glass sheet 8 serving as the light-transparent substrate 3, has a known structure comprising a light-transparent conductive layer 10, a PIN junction type non-single-crystal semiconductor laminate member 11 and a conductive layer 17 laminated in this sequential order. The laminate member 11 is, for example, 0.3 to 1μ thick. Each conductive layer is for example, 0.05 to 0.3 μm thick.

The PIN type non-single-crystal semiconductor layer 11 is composed of a P- or N-type non-single-crystal semiconductor layer 12, an I-type non-single-crystal semiconductor layer 13 formed on the layer 12 and a non-single-crystal semiconductor layer 14 formed on the layer 13 and opposite in conductivity type from the layer 12. Accordingly, the PIN type non-single-crystal semiconductor layer 11 has formed therein one PIN junction.

It is preferable that between the light-transparent substrate 3 formed by the thin, flexible, chemically reinforced glass sheet 8 and the laminate member 4 for photoelectric conversion use there be provided an impurity blocking layer 18 for preventing the introduction of potassium and other impurities from the glass sheet 8 into the laminate member 4. The impurity blocking layer 18 may be formed of a silicon nitride ($Si_3N_4$), for instance.

The laminate member 4 for photoelectric conversion is covered with a protective layer 19 of a resinous material. An impurity blocking layer 15 similar to the above-said layer 18 may preferably be formed between the laminate member 4 and the protective layer 19. The impurity blocking layer 15 is intended to prevent raindrops and impurities contained therein from entering into the laminate member 4 through the protective layer 19.

A frame 2 supporting such photoelectric conversion panels 1 in side-by-side relation is formed by a known flexible plastic frame 16 reinforced with carbon fibers. The flexible plastic frame 16 is flexible to substantially the same extent as the photoelectric conversion panel 1.

Accordingly, even if the photoelectric conversion panel assembly of the present invention is subjected to bending stresses as by wind pressure, the frame 1 ensures absorption of the bending stresses.

The photoelectric conversion panel assembly of the present invention shown in FIG. 1 is used with the panels electrically connected in series or in parallel and with the light-transparent substrates 3 of the panels facing the light source.

When the photoelectric conversion panel assembly shown in FIG. 1 is subjected to large bending stresses, the photoelectric conversion panels 1 and the frame 2 are bent, so that the panel assembly is also bent correspondingly. In this case, the laminate member 4 for photoelectric conversion use formed on the substrate 3 of each photoelectric conversion panel 1 is also bent, but this poses substantially no problems partly because the laminate member 4 is thin and partly because the PIN type non-single-crystal semiconductor laminate member 11 is formed of a non-single-crystal semiconductor. Accordingly, even if exposed to large bending stresses, the panel assembly would not be broken even if hit by an object such as a pebble. Besides, the panel assembly of the present invention is lightweight, and hence is easy to handle. In addition, the impurity blocking layers 13 and 15 of each photoelectric conversion panel 1 ensure prevention of the photoelectric conversion efficiency from being lowered by long-time use.

While in the foregoing the photoelectric conversion panel of the present invention has been described, along with the panel assembly, it will be apparent that many modifications and variations may be effected without departing from the scope of the novel concepts of the present invention.

What is claimed is:

1. A photoelectric conversion panel comprising:

a light-transparent substrate; and a laminated member formed on the substrate and comprising, in sequence, a light-transparent first conductive layer, at least one PIN type non-single-crystal semiconductor laminate photoelectric conversion member, and a second conductive layer;

wherein the substrate comprises a flexible, chemically reinforced glass sheet having potassium containing glass layers formed in the opposite main surfaces of an alkali free or alkali containing glass sheet having a thickness of 0.2 to 1.2 mm.

2. A photoelectric conversion panel according to claim 1, wherein the chemically reinforced glass sheet is reinforced with carbon fibers or carbon cloth disposed in or on at least one of the main surfaces thereof.

3. A photoelectric conversion panel according to claim 1, which further comprises an impurity blocking layer provided between the chemically reinforced glass sheet forming the light-transparent substrate and the laminated photoelectric conversion member for preventing entrance of potassium into the laminate member from the potassium containing glass layers.

4. A photoelectric conversion panel according to claim 3, wherein the impurity blocking layer comprise a silicon nitride layer.

5. A photoelectric conversion panel assembly comprising:

a plurality of photoelectric conversion panels disposed side by side in a frame;

wherein each photoelectric conversion panel comprises a light-transparent substrate and a laminated member formed on the substrate and comprising, in sequence, a light-transparent first conductive layer, at least one PIN type non-single-crystal semiconductor laminate member, and a second conductive layer;

wherein the light-transparent substrate of each photoelectric conversion panel comprises a flexible, chemically reinforced glass sheet having potassium containing glass layers formed in the opposite main surfaces of an alkali free or alkali containing glass sheet having a thickness of 0.2 to 1.2 mm; and wherein the frame is a flexible plastic frame reinforced with carbon fibers.

6. A photoelectric conversion panel assembly according to claim 5, wherein the flexible plastic frame has substantially the same flexibility as does the chemically reinforced glass sheet serving as the light-transparent substrate.

*7. A semiconductor device comprising:*

*at least one non-single-crystal semiconductor layer;*

*an alkali containing, glass substrate for supporting the non-single-crystal semiconductor layer where the substrate comprises a flexible, chemically reinforced glass sheet having potassium containing glass layers formed in the opposite main surfaces of an alkali free or alkali containing glass sheet having a thickness of 0.2 to 1.2 mm; and*

*an impurity blocking layer disposed between the alkali containing, glass substrate and the non-single-crystal semiconductor layer for preventing the potassium in the substrate from entering the semiconductor layer.*

*8. A semiconductor device as in claim 7 where said impurity blocking layer comprises silicon nitride.*

*9. A semiconductor device as in claim 7 where said non-single-crystal semiconductor layer is photoelectric.*

*10. A photoelectric device comprising:*

*at least one photoelectric, non-single-crystal semiconductor layer;*

*a pair of electrodes in electrical contact with the photoelectric, non-single-crystal semiconductor layer;*

*an alkali containing, glass substrate for supporting the photoelectric, non-single-crystal semiconductor layer where the substrate comprises a flexible, chemically reinforced glass sheet having potassium containing glass layers formed in the opposite main surfaces of an alkali free or alkali containing glass sheet having a thickness of 0.2 to 1.2 mm;*

*an impurity blocking layer disposed between the alkali containing, glass substrate and the photoelectric, non-single-crystal semiconductor layer for preventing the potassium in the substrate from entering the photoelectric layer.*

*11. A semiconductor device as in claim 10 where said impurity blocking layer comprises silicon nitride.*

* * * * *